United States Patent
Tam et al.

(10) Patent No.: US 9,461,465 B1
(45) Date of Patent: Oct. 4, 2016

(54) OVERVOLTAGE PROTECTION ANALOG SWITCH

(71) Applicant: Pericom Semiconductor Corporation, Milpitas, CA (US)

(72) Inventors: Yiu-Ming Tam, Hong Kong (HK); Chi-Wa Lo, Hong Kong (HK); Sin-Luen Cheung, Hong Kong (HK)

(73) Assignee: Pericom Semiconductor Corporation, Milpitas, CA (US)

( * ) Notice: Subject to any disclaimer, the term of this patent is extended or adjusted under 35 U.S.C. 154(b) by 353 days.

(21) Appl. No.: 14/138,708

(22) Filed: Dec. 23, 2013

Related U.S. Application Data

(60) Provisional application No. 61/746,342, filed on Dec. 27, 2012.

(51) Int. Cl.
  *H02H 3/20* (2006.01)
  *H02H 9/00* (2006.01)
  *H02H 9/04* (2006.01)

(52) U.S. Cl.
  CPC ..................... *H02H 9/04* (2013.01)

(58) Field of Classification Search
  CPC ........... H02H 3/20; H02H 9/04; H02H 9/041
  USPC ...................................................... 361/91.1
  See application file for complete search history.

(56) References Cited

U.S. PATENT DOCUMENTS

| | | | | |
|---|---|---|---|---|
| 5,153,454 A | * | 10/1992 | Kohdaka | H03K 5/249 327/124 |
| 5,666,082 A | * | 9/1997 | Wilenken | H03K 17/0822 327/379 |
| 5,703,518 A | * | 12/1997 | Yamamoto | G01R 19/22 307/127 |
| 8,237,414 B1 | | 8/2012 | Li | |
| 2004/0119522 A1 | * | 6/2004 | Tachibana | H03K 17/063 327/390 |
| 2013/0088287 A1 | * | 4/2013 | Araki | H03K 17/08122 327/543 |
| 2014/0085761 A1 | * | 3/2014 | Croft | H03K 17/0822 361/91.5 |

OTHER PUBLICATIONS

U.S. Appl. No. 13/540,515, Multi-Mode Charger Device, filed Jul. 2, 2012.
U.S. Appl. No. 13/766,647, Intermediary Signal Conditioning Device With Interruptible Detection Mode, filed Feb. 13, 2013.
U.S. Appl. No. 13/713,390, Auto Plug-In and Plug-Out VGA Port Detection, filed Dec. 13, 2012.

* cited by examiner

*Primary Examiner* — Dharti Patel
(74) *Attorney, Agent, or Firm* — The Webostad Firm

(57) ABSTRACT

An apparatus relates generally to an analog switch. In such apparatus, the analog switch has a transistor. A first node of the transistor is coupled to an input node of the analog switch. A second node of the transistor is coupled to an output node of the analog switch. An overvoltage protection circuit is coupled to provide a control voltage to a gate node of the transistor. The overvoltage protection circuit is used to at least substantially reduce an overvoltage state caused by an analog voltage at the input node of the analog switch exceeding an overvoltage threshold voltage.

20 Claims, 7 Drawing Sheets

OVERVOLTAGE PROTECTION ANALOG SWITCH

FIELD

One or more embodiments generally relate to an integrated circuit ("IC"). More specifically, one or more embodiments relate generally to an analog switch with overvoltage protection for an IC.

BACKGROUND

Conventionally, analog switches have been significantly lacking in at least one of three respects. Such conventional analog switches may: not provide sufficient maintenance of signal integrity during an overvoltage condition; not provide sufficient protection against overvoltage stress for downstream circuitry; not provide sufficiently fast response time to reduce overvoltage an output of such analog switch to protect downstream circuitry; and/or have too much static power consumption.

Accordingly, it would be desirable and useful to provide an analog switch with overvoltage protection that overcomes the aforementioned limitations.

BRIEF SUMMARY

An apparatus relates generally to an analog switch. In such apparatus, the analog switch has a transistor. A first node of the transistor is coupled to an input node of the analog switch. A second node of the transistor is coupled to an output node of the analog switch. An overvoltage protection circuit is coupled to provide a control voltage to a gate node of the transistor. The overvoltage protection circuit is used to at least substantially reduce an overvoltage state caused by an analog voltage at the input node of the analog switch exceeding an overvoltage threshold voltage.

An apparatus relates generally to a differential multiplexer/demultiplexer having a first pair of analog switches and a second pair of analog switches. In such an apparatus, the first pair of analog switches is disposed between a first differential interface and a second differential interface. The second pair of analog switches is disposed between the first differential interface and a third differential interface. Control logic is coupled to the differential multiplexer/demultiplexer. The control logic is configured to provide control signaling to the differential multiplexer/demultiplexer for controllably coupling and decoupling the first differential interface to the second differential interface and the third differential interface via the first pair of analog switches and the second pair of analog switches, respectively. A pair of overvoltage protection circuits is coupled to the first differential interface and to the differential multiplexer/demultiplexer to at least substantially reduce an overvoltage state caused by a differential analog voltage input exceeding an overvoltage threshold voltage on an analog switch of the first pair of analog switches and the second pair of analog switches.

A method generally relates to an analog switch. In such method, an input voltage is received by the analog switch and an overvoltage protection circuit. A source voltage and a reference voltage are provided to the overvoltage protection circuit. A first control voltage and a second control voltage are generated by the overvoltage protection circuit for the analog switch. This generation includes: pumping energy by a gate pump of the overvoltage protection circuit into the first control voltage; and comparing the input voltage and the reference voltage to provide the second control voltage. An output voltage, as described below, is output from the analog switch.

For an overvoltage state, for the method described in the immediately preceding paragraph, the first control voltage is regulated by the overvoltage protection circuit using the reference voltage. The first control voltage is applied to a first gate of a first transistor of the analog switch. A second control voltage is pulled up responsive to the comparing of the input voltage and the reference voltage. The second control voltage is applied to a second gate and a body bias voltage switch of a second transistor of the analog switch. The second control voltage is pulled up in response to an overvoltage level of the input voltage to put the second transistor in a substantially non-conductive state by the pulling up of the second gate of the second transistor and switching the body bias voltage switch to apply the input voltage to a body region of the second transistor. The first control voltage is regulated to allow the input voltage to propagate through a channel of the first transistor using the reference voltage to adjust down the output voltage in response to the overvoltage level.

BRIEF DESCRIPTION OF THE DRAWING(S)

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments. It should be apparent, however, to one skilled in the art, that the invention may be practiced without all the specific details given below. In other instances, well-known features have not been described in detail so as not to obscure the embodiments. For ease of illustration, the same number labels are used in different diagrams to refer to the same items; however, in alternative embodiments the items may be different. Furthermore, though particular numerical examples may be described herein for purposes of clarity by way of example, it should be understood that the scope of the description is not limited to these particular numerical examples as other values may be used unless expressly stated otherwise.

In the following description, for purposes of explanation, specific nomenclature is set forth to provide a thorough understanding of the various inventive concepts disclosed herein. However, it will be apparent to one skilled in the art that these specific details are not required in order to practice the various inventive concepts disclosed herein.

Figure 1:
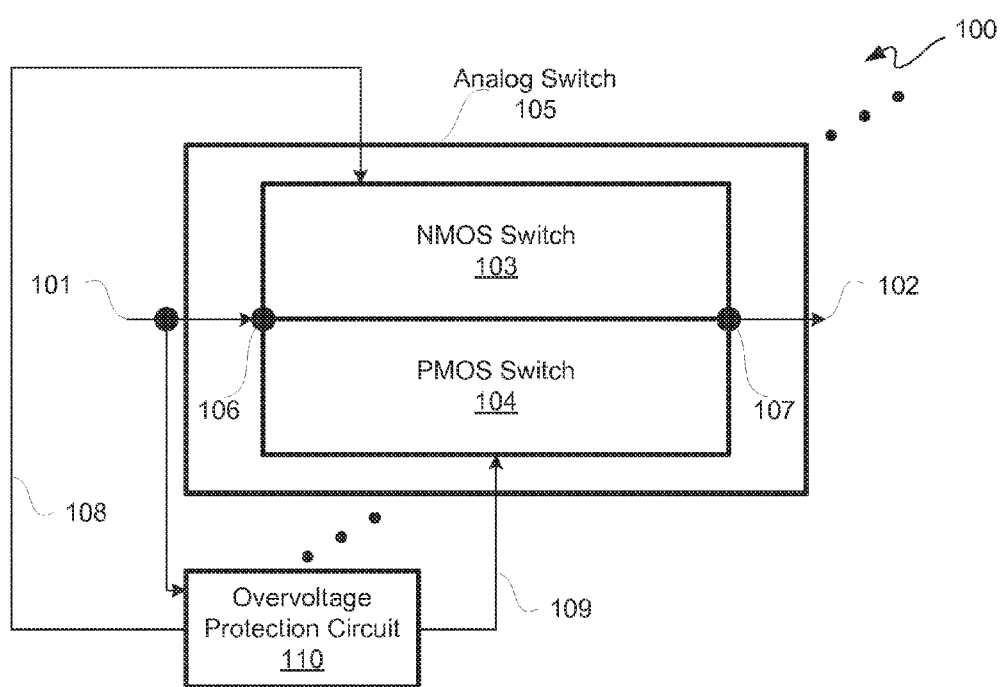
FIG. 1 is a block diagram depicting an exemplary overvoltage protection system.

FIG. 1 is a block diagram depicting an exemplary overvoltage protection system 100. Overvoltage protection system 100 includes analog switch 105 and overvoltage protection circuit 110. Overvoltage protection system 100 may be part of a standalone IC or may be embedded in a larger IC, namely any IC configured to receive an analog voltage signal ("analog voltage"). With respect to the latter, overvoltage protection system 100 may be used accommodate an external analog voltage provided to such IC, where such IC uses an internal analog voltage with a lower maximum voltage amplitude than possibly provided by such external analog voltage.

For example, if an external analog voltage had a maximum voltage amplitude of approximately 5 volts ("V"), and if such IC used an internal analog voltage with a maximum voltage amplitude of approximately 3 V, overvoltage protection system 100 may be used to bridge such differences in maximum voltage amplitudes allowed by limiting any external analog voltage in a range of approximately 3 to 5 V to be an internal analog voltage of approximately 3 V, possibly subject to some delay in cutting in and reacting to an overvoltage state, as described below in additional detail. Even though specific values were used for purposes of clarity, these and/or other voltage values may be used.

More generally, overvoltage protection circuit 110 may be used to prevent and/or at least substantially reduce or otherwise work against an overvoltage state on an analog input voltage being an excessive overvoltage condition on an analog output voltage. By an overvoltage state or condition, it is generally meant an analog voltage amplitude on an input signal that exceeds a specified maximum analog operating voltage amplitude on an output signal. Thus, for example, overvoltage protection circuit 110 may be positioned at an input interface, or at least proximate to an internal input interface, of an IC for bridging a difference in maximum analog voltage amplitude, where an external analog voltage may exceed a maximum internal operating analog voltage amplitude specified. Along those lines, for each analog voltage input, there may be an analog switch 105 coupled to an overvoltage protection circuit 110, and thus an IC may include multiple analog switches 105 and associated overvoltage protection circuits 110. For purposes of clarity by way of example not limitation, a single instance of an analog switch 105 and an associated overvoltage protection circuit 110 in a standalone analog overvoltage protection bridge IC is described in additional detail; however, multiple instances of such overvoltage protection system 100 in a standalone IC and/or embedded in a larger IC may be understood from such description that follows. Additionally, even though single-ended signaling is generally described herein, such signaling may be differential signaling in other implementations. Overvoltage protection as described herein may be used with bidirectional signaling, even though unidirectional signaling is generally described herein for purposes of clarity by way of example and not limitation.

An analog input voltage ("Vin") 101 is provided to an input node 106 of analog switch 105. Analog switch 105 may include, in addition to input node 106 and output node 107, an NMOS switch 103 and a PMOS switch 104. Switches of opposite polarity may be used to span an entire dynamic analog voltage range of analog input voltage ("Vin") 101 on an input side of analog switch 105 and an entire dynamic analog voltage range of analog output voltage ("Vout") 102 on an output side of analog switch 105, where such input side analog voltage range has a higher specified maximum operating voltage amplitude than such output side analog voltage range.

NMOS switch 103 and PMOS switch 104 may be coupled to input node 106 and output node 107, as described below in additional detail. Overvoltage protection circuit 110 may be coupled to input node 106 of analog switch 105 to source analog input voltage 101 therefrom. Overvoltage protection circuit 110 may be configured to provide a control voltage signal ("control voltage") 108 to NMOS switch 103 and a control voltage 109 to PMOS switch 104. Should overvoltage protection circuit 110 encounter or detect an overvoltage state on analog input voltage ("input voltage") 101, control voltages 108 and 109 may automatically be adjusted accordingly to prevent or at least substantially suppress an overvoltage condition on input voltage 101 from appearing with a same magnitude on analog output voltage ("output voltage") 102, as described below in additional detail.

Overvoltage protection circuit 110 may prevent or at least substantially suppress such overvoltage condition while retaining or maintaining signal integrity of input voltage 101 realized as output voltage 102. Along those lines, during an overvoltage state, NMOS switch 103 may be controlled to allow passage of a constrained amount of input voltage 101, namely NMOS switch 103 may be in a conductive state ("ON"), during an overvoltage condition, while PMOS switch 104 may be controlled to be in a substantially nonconductive state ("OFF") during such overvoltage state. Further, overvoltage protection circuit 110 may be configured to maintain signal integrity during non-overvoltage conditions, namely generally when input voltage 101 is in an acceptable dynamic range of output voltage 102.

From the following description, it shall be appreciated that for an overvoltage condition on input voltage 101, input voltage 101 may be quickly suppressed to limit its magnitude on output voltage 102 to protect downstream circuitry. Further, overvoltage protection circuit 110 may be configured to consume a little amount of static power. From the following description, it may be understood that overvoltage protection circuit 110 may consume a small amount of semiconductor die area and may be implemented using a standard CMOS process.

Figure 2:
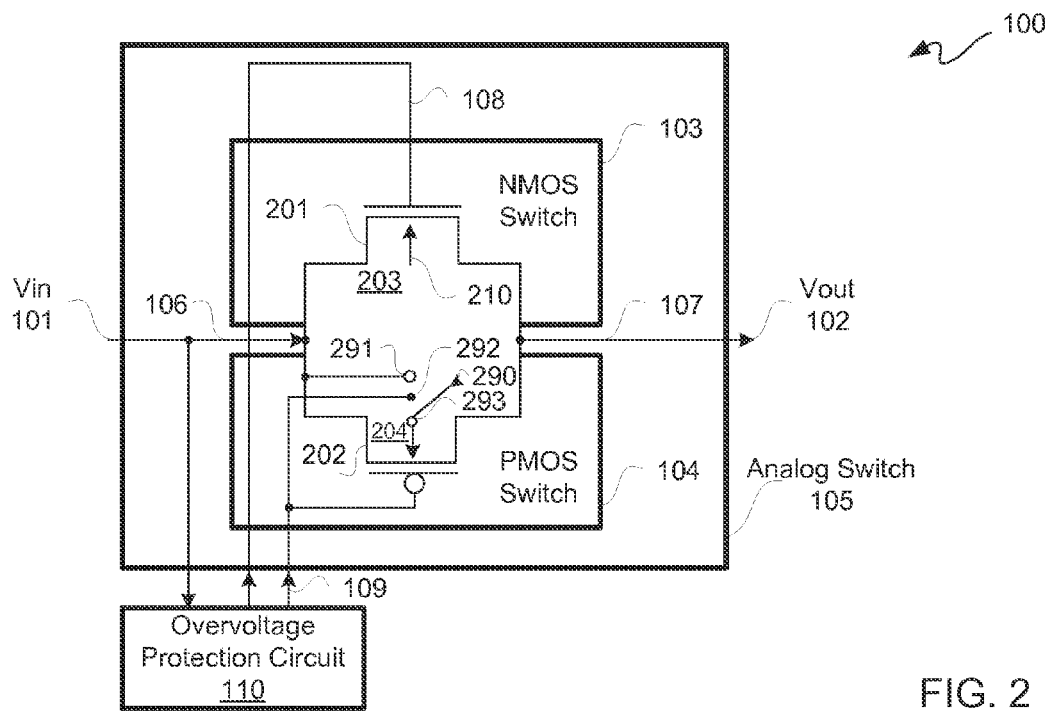
FIG. 2 is a block/circuit diagram depicting an exemplary coupling of an overvoltage protection circuit to an NMOS switch and a PMOS switch of an analog switch for the overvoltage protection system of FIG. 1.

FIG. 2 is a block/circuit diagram depicting an exemplary coupling of overvoltage protection circuit 110 to NMOS switch 103 and PMOS switch 104 of analog switch 105 for overvoltage protection system 100. In this exemplary configuration, NMOS switch 103 is provided with an NMOS transistor 201, and PMOS switch 104 is provided with a PMOS transistor 202. A source/drain node, more generally an input node, of each of transistors 201 and 202 is coupled to input node 106, and another source/drain node, more generally an output node, of each of transistors 201 and 202 is coupled to output node 107.

A control voltage 108 is provided from overvoltage protection circuit 110 as a gating voltage or gate voltage to a gate of NMOS transistor 201. A control voltage 109 is provided from overvoltage protection circuit 110 as a gating voltage or gate voltage to a gate of PMOS transistor 202. As described below in additional detail body region 204 of PMOS transistor 202 may be self-biased, such as for example coupled to source of PMOS transistor 202 (as generally indicated with a switch 290 in a closed position) in order to be coupled to a highest potential in an overvoltage protection system 100 during an overvoltage state. Along those lines, control voltage 109 may effectively be provided to a node or region 292 disposed between a body region 204 of transistor 202, generally depicted as a switch node 293, and a node of input node 106, generally depicted as another switch node 291.

Figure 3:
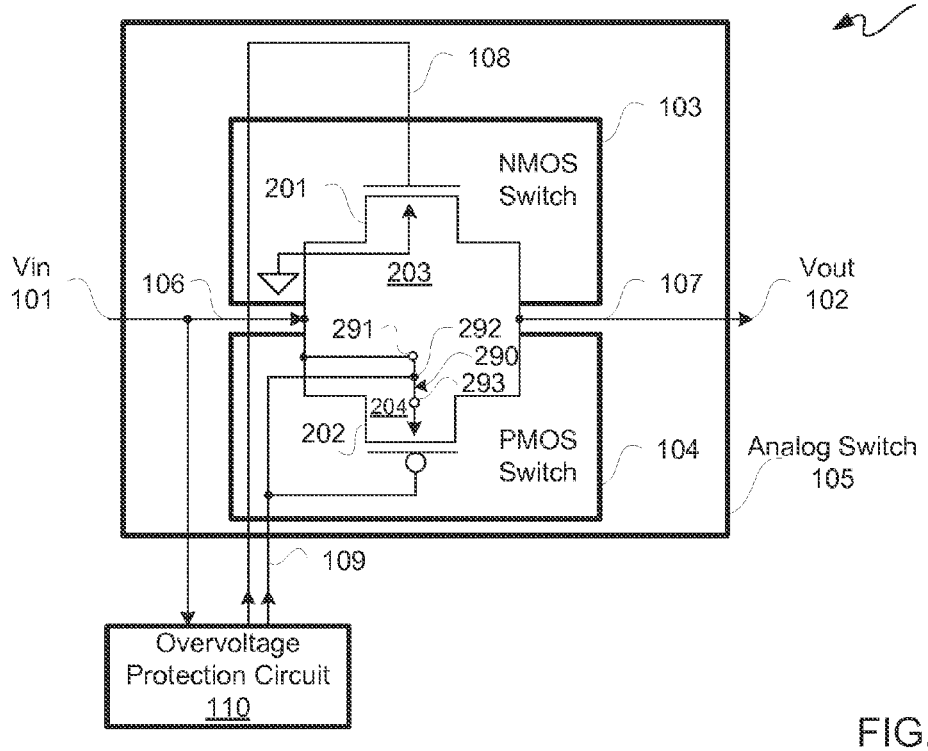
FIG. 3 is a block/circuit diagram depicting another exemplary coupling of an overvoltage protection circuit to an NMOS switch and a PMOS switch of an analog switch for the overvoltage protection system of FIG. 1.

For a non-overvoltage state, a body bias voltage switch, as generally indicated as switch 290, may connect the body region to a power supply voltage Vdd. However, when an overvoltage state arises, control voltage 109, which may be sourced from an output of a comparator of overvoltage protection circuit 110 (described below in additional detail) may effectively switch to apply overvoltage to body region 204 of PMOS transistor 202, namely to apply an overvoltage on analog input voltage ("Vin") 101 to body region 204. In this overvoltage state, switch 290 may effectively be closed as between switch nodes 291 and 293, as generally indicated in FIG. 3 for example. In an overvoltage state, analog input voltage ("Vin") 101 may be a highest potential in overvoltage protection system 100. Hereinafter, control voltage 108 may be referred to as a gate voltage 108, and control voltage 109 may be referred to as a gate voltage 109. A body region 203 of NMOS transistor 201 may be self-biased, as generally indicated by arrow 210. However, by not coupling output of a comparator to body region 203 of NMOS transistor 201, during an overvoltage state on input voltage 101, and by using such output of such comparator to pull up PMOS transistor 202, signal integrity may be substantially be maintained during an overvoltage condition, as described below in additional detail.

FIG. 3 is a block/circuit diagram depicting another exemplary coupling of overvoltage protection circuit 110 to NMOS switch 103 and PMOS switch 104 of analog switch 105 for overvoltage protection system 100. FIGS. 2 and 3 are the same except for the following. In FIG. 3, body region 203 of transistor 201 is coupled to ground, and body region 204 of transistor 202 is coupled to analog input voltage ("Vin") 101 to indicate response to an overvoltage state.

With reference to FIGS. 2 and 3, in both an overvoltage protection state and a non-overvoltage protection state, a body region 203 of transistor 201 may be self-bias, voltage biased, grounded, or pulled to a lowest potential in overvoltage protection system 100. However, body region 203 of transistor 201 is not coupled to output of comparator 403, such as through an inverter. Avoiding such coupling allows for signal integrity to be substantially be preserved during an overvoltage condition.

Figure 4:
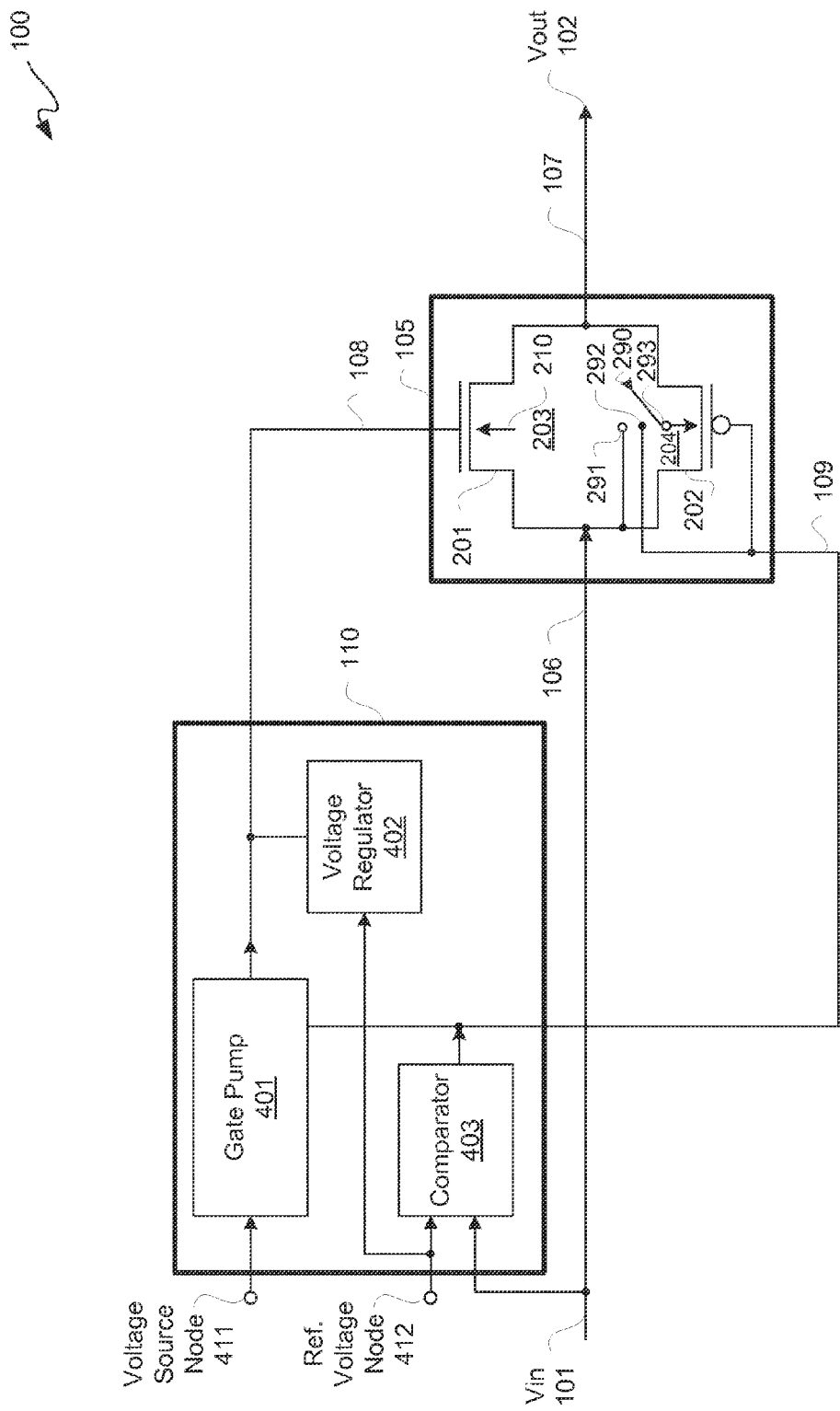
FIG. 4 is a block/circuit diagram depicting an exemplary overvoltage protection circuit coupled to an analog switch for the overvoltage protection system of FIG. 1.

FIG. 4 is a block/circuit diagram depicting an exemplary overvoltage protection circuit 110 coupled to analog switch 105 for an overvoltage protection system 100. For purposes of clarity by way of example and not limitation, it shall be assumed that analog switch 105 is coupled to overvoltage protection circuit 110 as illustratively described with reference to FIG. 2. Furthermore, for purposes of clarity, as analog switch 105 has already been described herein, such description is not repeated.

Overvoltage protection circuit 110 includes a gate pump 401, a voltage regulator 402, and a comparator 403. An input of gate pump 401 may be coupled to a source voltage node 411 to obtain or receive a source voltage ("source voltage 411"). Such a source voltage 411 generally may be a constant DC voltage. For purposes of clarity by way of example and not limitation, such source voltage 411 may be a supply voltage associated with an IC in which overvoltage protection system 100 is located. Such source voltage 411 may be Vcc, Vdd, or some other voltage of such IC.

For purposes of clarity and not limitation, it shall be assumed that source voltage 411 is a supply voltage, such as Vdd, where such supply voltage is an overvoltage threshold level ("overvoltage level"). Accordingly, during both ON and OFF states of analog switch 105, when input voltage 101 at analog switch 105 input node 106 is higher than such a supply voltage 411, output voltage 102 of analog switch 105 may be limited to be at least approximately at such supply voltage 411 to protect downstream circuitry coupled to output node 107. An overvoltage threshold level may be a predetermined level for an application, or may be an in-the-field or dynamically adjusted level for and/or during operation.

Output of gate pump 401 may be gate voltage 108 which is provided to a gate of transistor 201. Such gate voltage 108 output from gate pump 401 may further be coupled by voltage regulator 402 to regulate a voltage level of gate voltage 108 output by gate pump 401. Voltage regulator 402 may be coupled to a reference ("Ref.") voltage node 412 to obtain a reference voltage ("reference voltage 412") therefrom.

Comparator 403 may likewise be coupled to reference voltage node 412 to obtain a reference voltage 412 therefrom to one input port of comparator 403, and another input port of comparator 403 may be coupled to input node 106 to obtain input voltage 101. Output of comparator 403 may be used to provide gate voltage 109. Gate voltage 109 sourced from an output port of comparator 403 may be provided to gate pump 401, as well as to node 292 and a gate of PMOS transistor 202. Generally, for a pump action, output of comparator 403 may cause gate pump 401 to pump during a rising edge of an overvoltage state or condition.

Accordingly, it should be appreciated that all voltages of overvoltage protection circuit 110 may generally be provided in a feed forward direction in order to more quickly provide control signals 108 and 109 to analog switch 105, namely to quickly adjust between an overvoltage condition and a non-overvoltage condition.

Figure 5:
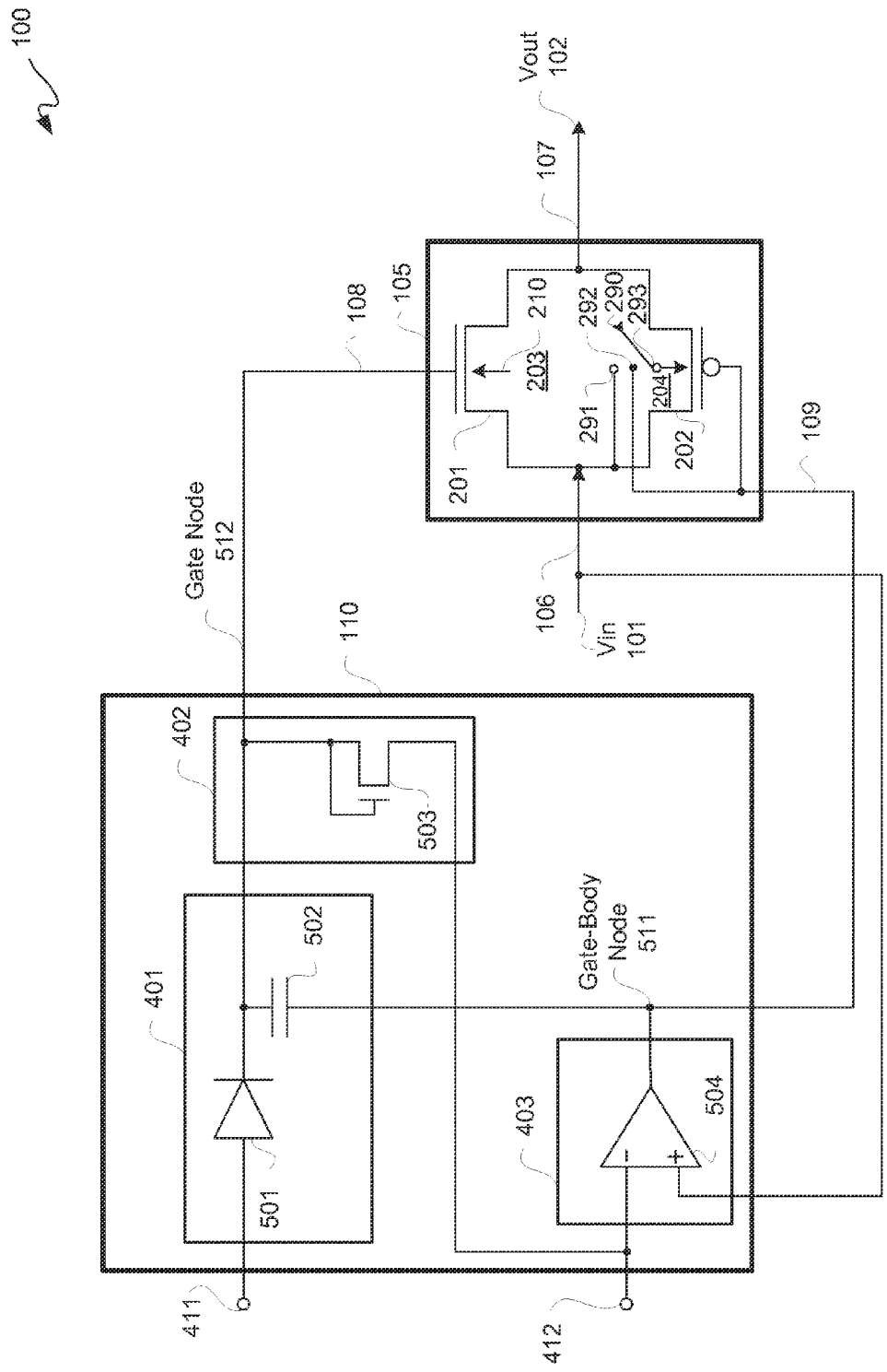
FIG. 5 is the block/circuit diagram of FIG. 4 with example circuits that may be used for components of an overvoltage protection circuit.

FIG. 5 is the block/circuit diagram of FIG. 4 with example circuits that may be used for components of overvoltage protection circuit 110. In this exemplary configuration, gate pump 401 includes a diode 501 and a capacitor 502, comparator 403 includes a CMOS comparator 504, and voltage regulator 402 includes a diode-connected NMOS transistor 503. Using a gate pump 401 may consume an insignificant amount of static power in comparison to a charge pump. Along those lines, a pump action here is not a continuous pumping as in a conventional charge pump operation, as gate pump 401 may not be activated without a voltage exceeding an overvoltage threshold level, namely an overvoltage protection ("OVP") event. Additionally, gate pump 401 may pump just one time during a rising edge of an OVP state. Charge stored in capacitor 502 may hold gate voltage 108 of NMOS transistor 203 for a sufficient amount of time until such OVP condition is removed or dissipated. Gate pump 401 may have little to no standby power consumption during a hard-shorted OVP event or during a non-OVP state of operation. Along those lines, gate pump 401 may generally only consume power during a series of OVP pulses. Furthermore, using a CMOS comparator 504, instead of an operational amplifier ("op amp") used as a comparator, may consume less power and/or may transition faster. Along those lines, a CMOS comparator 504 may be more sensitive and have less transition delay than an op amp.

An input of diode 501 is coupled to source voltage node 411 to receive a source voltage therefrom. Output of diode 501 may be coupled to a gate node 512 from which gate voltage 108 may be sourced. Also coupled to gate node 512 may be a top conductor ("plate") of capacitor 502. Further coupled to gate node 512 may be a gate and a source/drain node of NMOS transistor 503. Even though an NMOS transistor 503 as illustratively depicted for voltage regulator 402, in another configuration a PMOS transistor may be used. Furthermore, in another configuration a diode may be used in place of NMOS transistor 503. Another source/drain node of NMOS transistor 503 may be coupled to reference voltage node 412 to obtain a reference voltage 412 therefrom. In this configuration, voltage regulator 402 may be provided as a voltage clamp. More generally, voltage regulator 402 may be configured to provide a substantially constant voltage during an overvoltage condition between NMOS transistor's 201 gate and source ("Vgs"). Such constant voltage provided for gate voltage 108 during an overvoltage state may be regulated to a reference voltage level sourced from reference voltage node 412 plus Vgs of NMOS transistor 503 by having reference voltage node 412 coupled to gate node 512 through diode-connected NMOS transistor 503. However, other clamping voltage levels may be used, as may vary depending on the application. Control voltage 108 may be clamped at the gate of NMOS transistor 201. Again, even though such clamping may be illustratively depicted as provided with an NMOS transistor 503 coupled between the gate of NMOS transistor 201 and a reference voltage node 412 as a diode-connected transistor, other configurations may be used as described herein.

A minus port of CMOS comparator 504 may be coupled to reference voltage node 412 to obtain a reference voltage, and a plus port of CMOS comparator 504 may be coupled to input node 106 to obtain input voltage 101. An output port of CMOS comparator 504 may be provided to gate-body node 511 and used to source gate voltage 109. Gate-body node 511 may be coupled to a bottom plate of capacitor 502, as well as to a gate and a body region 204 of PMOS transistor 202 of analog switch 105.

Figure 6:
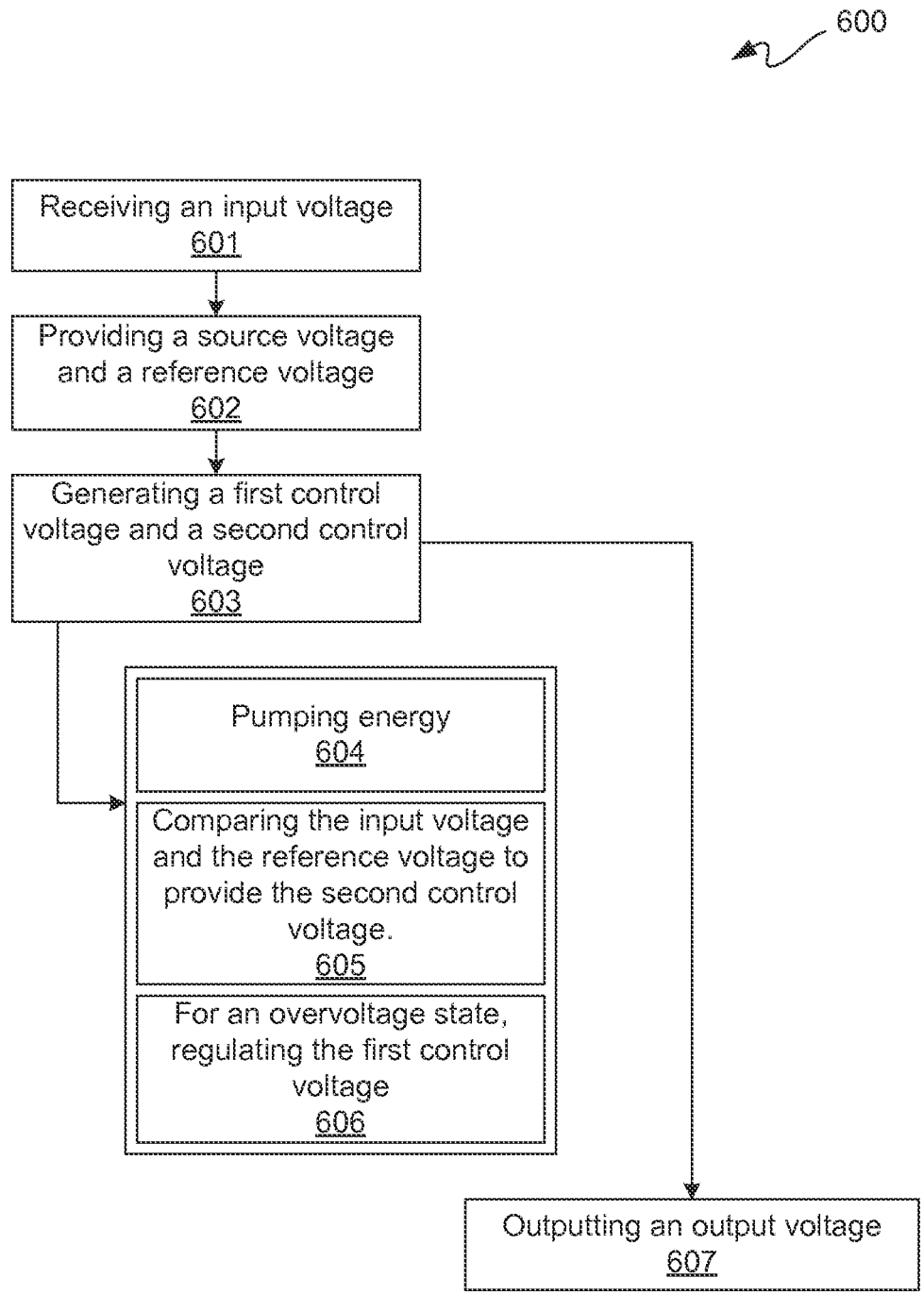
FIG. 6 is a flow diagram depicting an exemplary overvoltage protection flow.

FIG. 6 is a flow diagram depicting an exemplary overvoltage protection flow 600. Overvoltage protection flow 600 is further described with simultaneous reference to FIGS. 5 and 6.

At 601, an input voltage 101 may be received by analog switch 105 and overvoltage protection circuit 110. At 602, a source voltage sourced from source voltages node 411 and a reference voltage sourced from reference voltage node 412 are provided to overvoltage protection circuit 110.

At 603, overvoltage protection circuit 110 generates control voltages, namely gate voltages 108 and 109 to provide to analog switch 105. Generally, two operational states in which overvoltage protection system 100 may operate are an overvoltage state and a non-overvoltage state. For a non-overvoltage state, such generating at 603 may include operations at 604 and 605, and for an overvoltage state, such generating at 603 may include operations at 604, 605, and 606.

At 604, energy may be pumped by a gate pump 401 of overvoltage protection circuit 110 to provide gate voltage 108. At 605, such input voltage 101 obtained at 601 may be compared to such a reference voltage obtained at 602, such as by CMOS comparator 504, to provide gate voltage 109.

Control voltages 108 and 109 may generally be seamlessly generated for both non-overvoltage and overvoltage states without having overvoltage protection system 100 select between modes of operation.

At 606, for an overvoltage state, gate voltage 108 may be regulated by overvoltage protection circuit 110 using such reference voltage obtained at 602. In other words, provided input voltage 101 does not exceed an overvoltage level, voltage regulator 402 does not limit control voltage 108 so as to limit output voltage 102. However, for an overvoltage state, voltage regulator 402 may be used to generally hold or limit gate voltage 108 to a constant level. Thus, for example, if such overvoltage level was a level of a reference voltage sourced from reference voltage node 412, voltage regulator 402 may hold gate voltage 108 at such reference voltage level plus Vgs of NMOS transistor 503 during such overvoltage state. Along those lines, such reference voltage 412 may be used to set or otherwise provide such overvoltage threshold level. A reference voltage 412 level may be higher or lower, or the same as, an overvoltage threshold level.

At 607, after generating gate voltages 108 and 109, output voltage 102 may be output from analog switch 105. Such output voltage 102 may have a lower ceiling than input voltage 101, as previously described.

Figure 7:
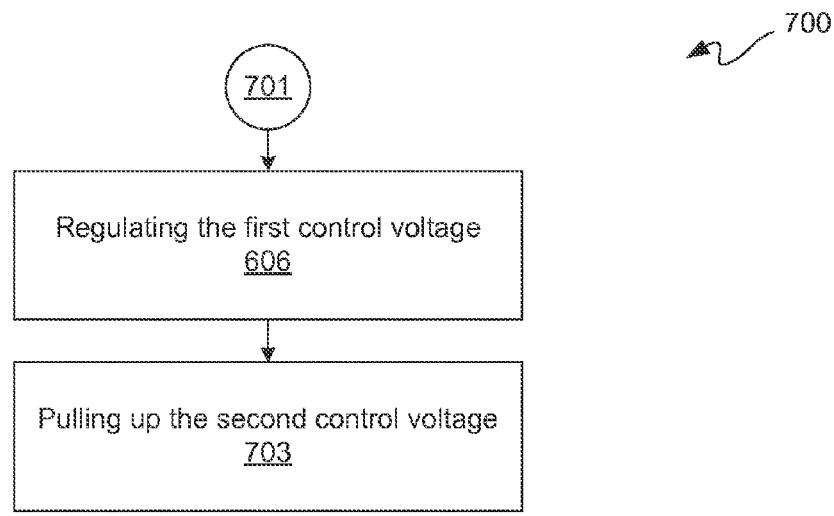
FIG. 7 is a flow diagram depicting an exemplary overvoltage flow.

FIG. 7 is a flow diagram depicting an exemplary overvoltage flow 700. Overvoltage flow 700 is further described with simultaneous reference to FIGS. 5, 6, and 7.

For an overvoltage state 701, namely where input voltage 101 exceeds a maximum voltage amplitude limit of output voltage 102, control voltage 108 applied to a gate of transistor 201 of analog switch 105 may be regulated at 606. It should be appreciated that output voltage 102 may from time-to-time have its maximum voltage amplitude limit exceeded; however, operating at such maximum voltage amplitude limit may be harmful to a downstream device. Thus, overvoltage protection system 100 may quickly bring down output voltage 102 to an overvoltage threshold level. For example, for an overvoltage threshold level being the same as a reference voltage level, output voltage 102 may be adjusted down to the level of such reference voltage. Control voltage 108 may be held or limited to allow input voltage 101 to propagate through a channel of transistor 201 though voltage level of input voltage 101 passing through such channel may be limited using a reference voltage 412 provided to regulator 402 to adjust down output voltage 102.

For such an overvoltage state 701, at 703, control voltage 109 applied to a gate and a body region 204 of transistor 202 of analog switch 105 may be pulled up responsive to comparing at 605. For example, when input voltage 101 exceeds a reference voltage sourced from reference voltage node 412, output of CMOS comparator 504 may be used to provide a voltage level of control voltage 109 that is at least approximately at a same level as input voltage 101. Thus, control voltage 109 may be used to pull voltages at a body region 204 and a gate of PMOS transistor 202 to at least approximately a same voltage level as input voltage 101. For an overvoltage state 701, such input voltage 101 level may be above an overvoltage threshold level, and thus control voltage 109 may be pulled up to the high voltage level of input voltage 101 to put PMOS transistor 202 in a substantially non-conductive state from source-to-drain. For completeness, for a reference voltage level exceeding a level of input voltage 101, output of CMOS comparator 504 may be used to provide a lower part of an entire dynamic range of input voltage 101 for passing through analog switch 105 as output voltage 102.

Control voltage 108 may be pulled up through a capacitive coupling between control voltage 108 and input voltage 101 via comparator 403 and capacitor 502. Control voltage 108 may be pulled up to a threshold voltage of NMOS transistor 101 above of a reference voltage level of reference voltage 412. This may be used to allow signal integrity to be preserved during an overvoltage state; however, other voltage levels may be used to hold NMOS transistor 203 in conductive though limited state, as previously described. Output voltage 102 of analog switch 105 may decrease in response to pulling up voltage on PMOS transistor 202 in an overvoltage protection state.

Figure 8:
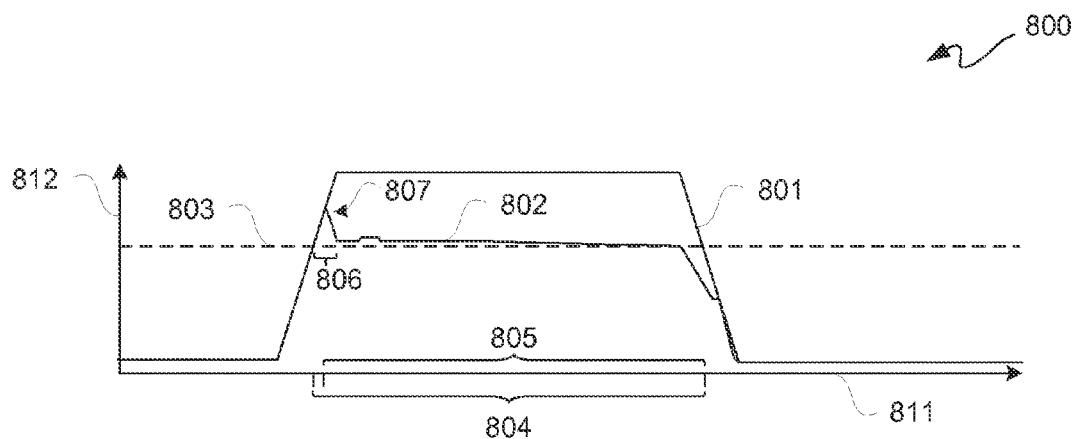
FIG. 8 is a graph depicting an exemplary Hspice simulated result.

FIG. 8 is a graph depicting an exemplary Hspice simulated result 800. Such graph has a vertical voltage amplitude axis 812 and a horizontal time axis 811. In simulated result 800, an input voltage 801, which may be input voltage 101 input to an analog switch 105 as previously described with reference to FIGS. 1 through 7. In simulated result 800, an output voltage 802, which may be output voltage 102 output from such analog switch 105 as previously described with reference to FIGS. 1 through 7, is superimposed on input voltage 801 for purposes of comparison. Level 803 may be an overvoltage threshold level.

For a length of time 804, input voltage 801 may exceed overvoltage threshold level 803. However, amplitude of output voltage 802 for length of time 805 corresponding to length of time 804, which may be substantially close in duration to length of time 804, may be held below a corresponding amplitude of input voltage 801. Moreover, during a substantial majority of length of time 805, output voltage 802 may be held within acceptable proximity to overvoltage level 803. Of course, there may be some delay for overvoltage protection to cut in and then react to an overvoltage state on input voltage 101, as generally indicated by output voltage 802 during time interval 806, namely where output voltage 802 has a spike 807.

Figure 9:
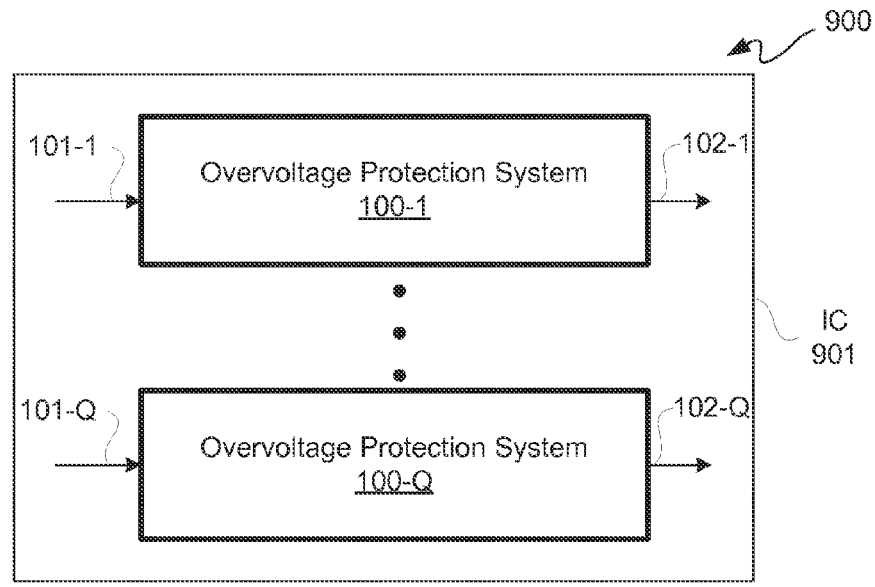
FIG. 9 is a block diagram depicting an exemplary analog-to-analog voltage converter.

FIG. 9 is a block diagram depicting an exemplary analog-to-analog voltage converter 900. Analog-to-analog voltage converter 900 may be an IC 901 formed having a plurality of overvoltage protection systems 100-1 through 100-Q, for Q a positive integer greater than one. Overvoltage protection systems 100-1 through 100-Q may be respectively coupled to receive analog input voltages 101-1 through 101-Q to respectively output analog output voltages 102-1 through 102-Q.

Figure 10:
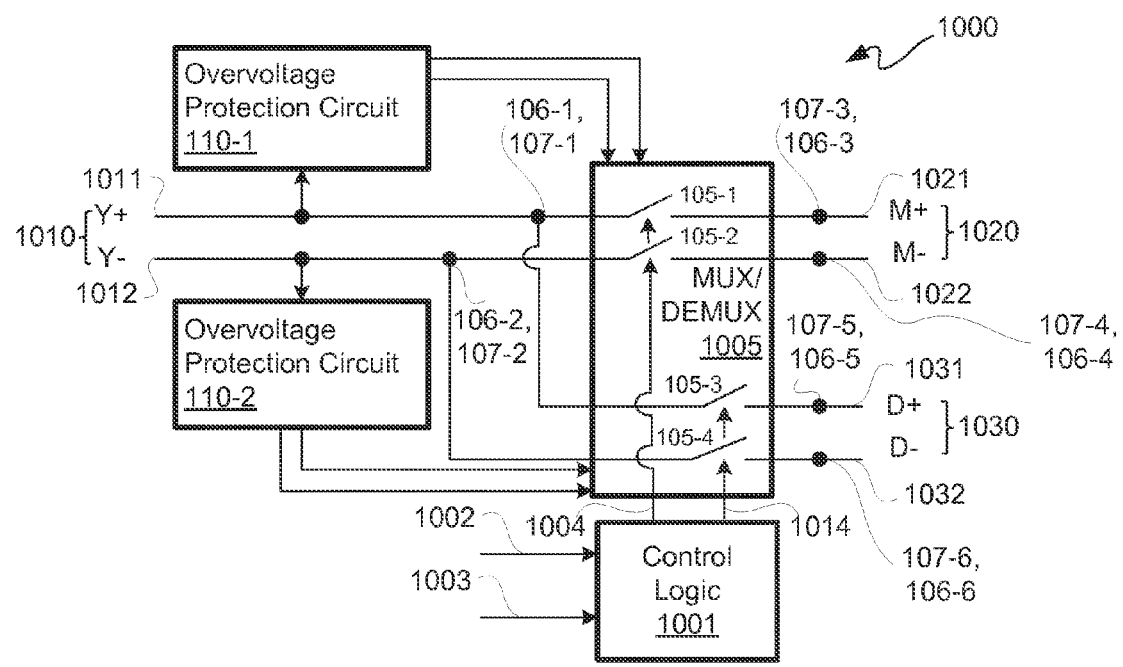
FIG. 10 is a block diagram depicting an exemplary single differential channel 2:1 multiplexer/demultiplexer switched overvoltage protection system.

FIG. 10 is a block diagram depicting an exemplary single differential channel 2:1 multiplexer/demultiplexer switched overvoltage protection system 1000. Single differential channel 2:1 multiplexer/demultiplexer switched overvoltage protection system 1000 may include overvoltage protection systems 100-1 and 100-2 corresponding to separate instances of overvoltage protection system 100 previously described herein. Single differential channel 2:1 multiplexer/demultiplexer switched overvoltage protection system 1000 may further include a multiplexer/demultiplexer 1005 and control logic 1001. Multiplexer/demultiplexer 1005 may include analog switches 105-1 through 105-4 corresponding to separate instances of analog switches 105 previously described herein.

In this example, overvoltage protection systems 100-1 and 100-2 may respectively be coupled to a differential interface 1010 via differential signal lines 1011 and 1012. For purposes of clarity by way of example and not limitation, differential interface 1010 shall be assumed to be a differential input 1010 for a multiplexing mode or a single channel to two channels mode ("channel fanout mode"); however, for a demultiplexing mode, differential interface 1010 may be a differential output.

Differential input 1010 may be for receiving a differential input signal on an input channel associated with analog switches 105-1 and 105-2 or analog switches 105-3 and 105-4. Analog switches 105-1 and 105-2 may be coupled to overvoltage protection circuit 110-1, as previously described herein with reference to overvoltage protection circuit 100 and analog switch 105. Likewise, analog switches 105-3 and 105-4 may be coupled to overvoltage protection circuit 110-2, as previously described herein.

A Y+ input of such differential input 1010 may be provided to an input node 106-1 coupled to differential signal line 1011, and a Y− input of such differential input may be provided to an input node 106-2 coupled to differential signal line 1012. Input node 106-1 may be an input node of analog switches 105-1 and 105-3, and input node 106-2 may be an input node of analog switches 105-2 and 105-4. In a demultiplexing mode, input nodes 106-1 and 106-2 may respectively be output nodes 107-1 and 107-2 of corresponding analog switches.

Output nodes 107-3 and 107-4 respectively of analog switches 105-1 and 105-2 may correspond to differential signal lines 1021 and 1022. In other words, differential signal lines 1021 and 1022 may be respectively coupled to output nodes 107-3 and 107-4 of corresponding analog switches 105-1 and 105-2. Likewise, output nodes 107-5 and 107-6 respectively of analog switches 105-3 and 105-4 may correspond to differential signal lines 1031 and 1032. In other words, differential signal lines 1031 and 1032 may be respectively coupled to output nodes 107-5 and 107-6 of corresponding analog switches 105-3 and 105-4. In a demultiplexing mode, output nodes 107-3 through 107-6 may respectively be input nodes 106-3 through 106-6 of corresponding analog switches.

Differential multiplexer/demultiplexer 1005 may be coupled to control logic 1001. Control logic 1001 may be coupled to receive an output enable signal 1002 and a control select signal 1003. Responsive to such control signals, control logic 1001 may cause differential multiplexer/demultiplexer 1005 to respectively couple differential signal lines 1011 and 1012 to differential signal lines 1021 and 1022 of differential interface 1020 and/or to differential signal lines 1031 and 1032 of differential interface 1030 through corresponding analog switches.

Generally, differential multiplexer/demultiplexer 1005 may have a first pair of analog switches 105-1 and 105-2 and a second pair of analog switches 105-3 and 105-4, and such switches 105-1 through 105-4 may be used for controllably coupling differential interfaces, as described herein. Switch 105-1 of differential multiplexer/demultiplexer 1005 may be coupled between signal line 1011 and signal line 1021; switch 105-2 of differential multiplexer/demultiplexer 1005 may be coupled between signal line 1012 and signal line 1022; switch 105-3 of differential multiplexer/demultiplexer 1005 may be coupled between signal line 1011 and signal line 1031; and switch 105-4 of differential multiplexer/demultiplexer 1005 may be coupled between signal line 1012 and signal line 1032. Switches 105-1 and 105-2 may be coupled for control by a switch control signal 1004 provided to differential multiplexer/demultiplexer 1005 from control logic 1001, and switches 105-3 and 105-4 may be coupled for control by a switch control signal 1014 provided to differential multiplexer/demultiplexer 1005 from control logic 1001.

As overvoltage protection circuits 110-1 and 110-2 are bidirectional, input may be from the right or left side of single differential channel 2:1 multiplexer/demultiplexer switched overvoltage protection system 1000. For input on the right side of single differential channel 2:1 multiplexer/demultiplexer switched overvoltage protection system 1000, differential interface 1010 may be a differential output, and one of differential interfaces 1020 and 1030 may be respective active differential input. For input on the right side, single differential channel 2:1 multiplexer/demultiplexer switched overvoltage protection system 1000 may be in a demultiplexing mode.

For input on the left side of single differential channel 2:1 multiplexer/demultiplexer switched overvoltage protection system 1000, differential interface 1010 may be a differential input and either or both of differential interfaces 1020 and 1030 may be an active differential output. For input on the left side, single differential channel 2:1 multiplexer/demultiplexer switched overvoltage protection system 1000 may be in a multiplexing mode or a channel fanout mode.

Thus, for example, a single channel may be coupled to two channels while at the same time providing overvoltage protection to such coupled channels, or a single channel may be coupled to another single channel as selected between two channels while at the same time providing overvoltage protection to such coupled channels. However, for purposes of clarity by way of example and not limitation, a multiplexing mode for a single input channel to single output channel is further described, where differential interface 1010 is a differential input 1010.

A first differential output signal M+ and M− on differential output 1020 may be coupled from a differential output channel of analog switches 105-1 and 105-2 via output nodes 107-3 and 107-4, respectively; or a second differential output signal D+ and D− on differential output 1030 may be coupled from a differential output channel of analog switches 105-3 and 105-4 via output nodes 107-5 and 107-6, respectively.

Along the above lines, for passing signaling to differential signal lines 1021 and 1022 in a multiplexing mode, control signal 1004 from control logic 1001 to differential multiplexer/demultiplexer 1005 may cause switches 105-1 and 105-2 thereof to be closed. For preventing passage of signaling to differential signal lines 1031 and 1032, control signal 1014 from control logic 1001 to switches 105-3 and 105-4 of multiplexer/demultiplexer 1005 may cause those switches to be open. For passing signaling to differential signal lines 1031 and 1032 in a multiplexing mode, control signal 1014 from control logic 1001 to switches 105-3 and 105-4 of multiplexer/demultiplexer 1005 may cause those switches to be closed, and control signal 1004 from control logic 1001 to differential multiplexer/demultiplexer 1005 may cause switches 105-1 and 105-2 thereof to be open.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An apparatus, comprising:
   an analog switch having a transistor;
   wherein a first node of the transistor is coupled to an input node of the analog switch;
   wherein a second node of the transistor is coupled to an output node of the analog switch; and
   an overvoltage protection circuit coupled to provide a control voltage to a gate node of the transistor;
   wherein the overvoltage protection circuit is configured to at least substantially reduce an overvoltage state caused by an analog voltage at the input node of the analog switch exceeding an overvoltage threshold voltage and allow passage of a constrained amount of the analog voltage through the analog switch during the overvoltage state.

2. The apparatus according to claim 1, wherein the overvoltage protection circuit includes:
   a gate pump to provide the control voltage to the gate node of the transistor;
   a comparator coupled to the gate pump, to a reference voltage node, and the input node of the analog switch; and
   a voltage regulator coupled to receive the control voltage to provide to the gate node of the transistor;
   wherein the overvoltage protection circuit is configured to suppress magnitude of the analog voltage to limit an analog voltage magnitude at the output node for the overvoltage state.

3. The apparatus according to claim 2, wherein:
   the transistor is a first transistor;
   the control voltage is a first control voltage;
   the analog switch has a second transistor;
   a first node of the second transistor is coupled to the input node of the analog switch;
   a second node of the second transistor is coupled to the output node of the analog switch; and
   the comparator provides a second control voltage to a gate node of the second transistor and to a body bias voltage switch of the second transistor to control bias of a body region of the second transistor;
   wherein the overvoltage protection circuit is configured to adjust the first control voltage to a clamping voltage level in response to the overvoltage state.

4. The apparatus according to claim 3, wherein:
   the comparator includes a CMOS comparator;
   a minus port of the CMOS comparator is coupled to the reference voltage node;
   a plus port of the CMOS comparator is coupled to the input node of the analog switch; and
   an output port of the CMOS comparator is coupled to the gate pump, as well as to the gate and the body bias voltage switch of the second transistor.

5. The apparatus according to claim 3, wherein the gate pump includes a diode and a capacitor.

6. The apparatus according to claim 3, wherein the voltage regulator is configured as a voltage clamp.

7. The apparatus according to claim 3, wherein:
   the voltage regulator includes a third transistor;
   a first node and a gate node of the third transistor are coupled to the gate node of the first transistor; and
   a second node of the third transistor is coupled to the reference voltage node.

8. The apparatus according to claim 3, wherein:
   the first transistor is a first NMOS transistor;
   the second transistor is a PMOS transistor; and
   the third transistor is a second NMOS transistor connected as a diode.

9. An apparatus, comprising:
   a differential multiplexer/demultiplexer having a first pair of analog switches and a second pair of analog switches;
   the first pair of analog switches disposed between a first differential interface and a second differential interface;

the second pair of analog switches disposed between the first differential interface and a third differential interface;

control logic coupled to the differential multiplexer/demultiplexer;

wherein the control logic is configured to provide control signaling to the differential multiplexer/demultiplexer for controllably coupling and decoupling the first differential interface to the second differential interface and the third differential interface via the first pair of analog switches and the second pair of analog switches, respectively; and a pair of overvoltage protection circuits coupled to the first differential interface and to the differential multiplexer/demultiplexer and configured to at least substantially reduce an overvoltage state caused by a differential analog voltage input exceeding an overvoltage threshold voltage on either or both of a first analog switch of the first pair of analog switches or a second analog switch of the second pair of analog switches, respectively;

wherein the pair of overvoltage protection circuits are configured to allow and constrain passage of the differential analog voltage input through either or both the first analog switch or the second analog switch, respectively, in response to the overvoltage state.

10. The apparatus according to claim 9, wherein for a multiplexing mode or a demultiplexing mode, the first differential interface is coupled to either the second differential interface or the third differential interface.

11. The apparatus according to claim 9, wherein for a channel fanout mode, the first differential interface is coupled to both the second differential interface and the third differential interface.

12. A method, comprising:

receiving an input voltage by an analog switch and an overvoltage protection circuit;

providing a source voltage and a reference voltage to the overvoltage protection circuit;

generating a first control voltage and a second control voltage by the overvoltage protection circuit for the analog switch;

wherein the generating includes:
  pumping energy by a gate pump of the overvoltage protection circuit into the first control voltage; and
  comparing the input voltage and the reference voltage to provide the second control voltage;

wherein for an overvoltage state,
  regulating the first control voltage by the overvoltage protection circuit using the reference voltage;
  wherein the first control voltage is applied to a first gate of a first transistor of the analog switch; and
  pulling up a second control voltage responsive to the comparing;

wherein the second control voltage is applied to a second gate and a body bias voltage switch of a second transistor of the analog switch;

wherein the second control voltage is pulled up in response to an overvoltage level of the input voltage to put the second transistor in a substantially non-conductive state by the pulling up of the second gate of the second transistor and switching the body bias voltage switch to apply the input voltage to a body region of the second transistor;

wherein the first control voltage is regulated to allow the input voltage to propagate through a channel of the first transistor using the reference voltage to adjust down an output voltage in response to the overvoltage level; and outputting the output voltage from the analog switch;

wherein the overvoltage protection circuit is configured to adjust the first control voltage to a clamping voltage level in response to the overvoltage state.

13. The method according to claim 12, wherein a level of the reference voltage is used to provide the overvoltage level.

14. The method according to claim 13, wherein:

the comparing is performed by a comparator to provide the second control voltage;

the pumping is performed by a diode coupled to receive the source voltage;

an output of the diode is a coupled to provide the source voltage received to a capacitor; and the regulating is performed by a voltage regulator coupled to receive the source voltage from the diode.

15. The method according to claim 14, wherein the first control voltage is pulled up through a capacitive coupling between the first control voltage and the input voltage via the comparator and the capacitor.

16. The method according to claim 15, wherein the comparator includes a CMOS comparator.

17. The method according to claim 12, wherein in both the overvoltage protection state and a non-overvoltage protection state, a body voltage of the first transistor is selected from a group consisting of self-biased, voltage biased, grounded, and pulled to a lowest potential of the overvoltage protection circuit.

18. The method according to claim 12, wherein the first control voltage is pulled up above of the reference voltage level.

19. The method according to claim 12, wherein the first control voltage is clamped at the first gate of the first transistor.

20. The method according to claim 12, wherein the second gate and the body of the second transistor are pulled up at least approximately to a level of the input voltage.

* * * * *